United States Patent
Wu et al.

(10) Patent No.: US 10,461,016 B2
(45) Date of Patent: Oct. 29, 2019

(54) CERAMIC MODULE FOR POWER SEMICONDUCTOR INTEGRATED PACKAGING AND PREPARATION METHOD THEREOF

(71) Applicant: Dongguan China Advanced Ceramic Technology Co., Ltd., Dongguan, Guangdong (CN)

(72) Inventors: Zhaohui Wu, Dongguan (CN); Wei Kang, Dongguan (CN); Xiaoquan Guo, Dongguan (CN); Jun Zhang, Dongguan (CN)

(73) Assignee: DONGGUAN CHINA ADVANCED CERAMIC TECHNOLOGY CO., LTD., Dongguan, Guangdong (CN)

(*) Notice: Subject to any disclaimer, the term of this patent is extended or adjusted under 35 U.S.C. 154(b) by 0 days.

(21) Appl. No.: 16/029,649

(22) Filed: Jul. 9, 2018

(65) Prior Publication Data

US 2019/0019740 A1    Jan. 17, 2019

(30) Foreign Application Priority Data

Jul. 13, 2017   (CN) .......................... 2017 1 0571008
Nov. 22, 2017   (CN) .......................... 2017 1 1176148

(51) Int. Cl.
  *H05K 1/02*       (2006.01)
  *H05K 1/11*       (2006.01)
  (Continued)

(52) U.S. Cl.
  CPC ........ *H01L 23/3735* (2013.01); *H01L 21/481* (2013.01); *H01L 21/486* (2013.01); *H01L 21/4853* (2013.01); *H01L 21/4871* (2013.01); *H01L 23/15* (2013.01); *H01L 23/49811* (2013.01); *H01L 23/49827* (2013.01); (Continued)

(58) Field of Classification Search
  CPC ............. H01L 23/3735; H01L 21/4853; H01L 21/486; H01L 21/4871; H01L 21/481; H01L 23/49866; H01L 23/49811; H01L 23/49827; H01L 23/49838; H01L 23/15; H05K 1/0201; H05K 1/0203; H05K 1/0204; H05K 1/11; H05K 1/18; H05K 1/181; H05K 1/183; H05K 2201/066; H05K 1/10416; H05K 1/095; H05K 1/09563; H05K 1/10674
  See application file for complete search history.

(56) References Cited

U.S. PATENT DOCUMENTS 9,093,626 B2 * 7/2015 Tomohiro ............... H01L 33/56
9,875,952 B2 * 1/2018 Okamoto .......... H01L 23/49838
(Continued)

*Primary Examiner* — Ishwarbhai B Patel
(74) *Attorney, Agent, or Firm* — Leong C. Lei

(57) ABSTRACT

A ceramic module for power semiconductor integrated packaging and a preparation method thereof are disclosed. The ceramic module includes a ceramic substrate and an integrated metal dam layer. By providing the integral metal dam layer on the upper surface of the ceramic substrate and forming cavities around die bonding regions, the semiconductor chip can be hermetically sealed. By providing a heat dissipation layer on the lower surface of the ceramic substrate, the heat generated by the semiconductor chip can be quickly conducted to the outside. The product has a simple production process and high product consistency.

10 Claims, 4 Drawing Sheets

(51) Int. Cl.
    *H05K 1/18*      (2006.01)
    *H01L 23/373*    (2006.01)
    *H01L 21/48*     (2006.01)
    *H01L 23/15*     (2006.01)
    *H01L 23/498*    (2006.01)

(52) U.S. Cl.
    CPC .. *H01L 23/49838* (2013.01); *H01L 23/49844* (2013.01); *H01L 23/49866* (2013.01); *H05K 1/0201* (2013.01); *H05K 1/0203* (2013.01); *H05K 1/11* (2013.01); *H05K 1/181* (2013.01)

(56) References Cited

U.S. PATENT DOCUMENTS

2003/0194835 A1* 10/2003 Kim .................. H01L 23/24
                                              438/113
2014/0160688 A1*  6/2014 Lu ................ H01L 23/49816
                                              361/728
2015/0124455 A1*  5/2015 Tamura ............. H01L 25/0753
                                              362/293

* cited by examiner

CERAMIC MODULE FOR POWER SEMICONDUCTOR INTEGRATED PACKAGING AND PREPARATION METHOD THEREOF

BACKGROUND OF THE INVENTION

1. Field of the Invention

The present invention relates to the field of power semiconductor packaging technology, and in particular to a ceramic module for power semiconductor integrated packaging and a preparation method thereof.

2. Description of the Prior Art

In integrated circuits and power electronics applications, semiconductor power devices for photoelectric conversion and power conversion have been widely used in various fields such as high-power light emitting diodes, lasers, motor control, wind power generation, and UPS. In recent years, the miniaturization of power semiconductor modules has become a trend in response to the space and weight requirements of power electronic systems.

In the power semiconductor module packaging process, in order to solve the problem of low power, low integration and insufficient functionality of a single chip, it is necessary to package multiple highly integrated, high-performance and high-reliability chips in a module through serial and parallel connection to achieve multi-chip integrated packaging.

Multi-chip integrated packaging will increase the current density flowing through the module, and the power consumption of the chip will also increase. Therefore, it is necessary to increase the thermal conductivity of the module. In addition, as the operating voltage increases, the insulation performance of the module needs to be improved. Therefore, it is necessary to select a low-resistivity wiring conductor material and a low-dielectric-constant, high-thermal-conductivity insulating material as a packaging carrier. A ceramic module just fits the requirements.

In the power semiconductor package, a ceramic module (or ceramic base) is an important carrier substrate for semiconductor chips and other microelectronic devices, providing the functions of forming a sealed chamber, mechanical support protection, electric interconnection (insulation), thermal conduction, heat dissipation, and auxiliary light. Ceramic modules used for power semiconductor packaging include HTCC/LTCC and DBC ceramic substrates.

HTCC is also called high-temperature co-fired multi-layer ceramics. LTCC is also called low-temperature co-fired multi-layer ceramics. This technology uses thick-film printing technology to complete circuit fabrication. Therefore, the circuit surface is rough (Ra is about 1 to 3 um), and alignment is not accurate. Besides, multi-layer ceramic laminates, high temperature sintering and other processes make ceramic modules inaccurate in size and high in curvature. In addition, the ceramic material used in this process has a complex formulation and a low thermal conductivity, and requires special molding die, long manufacturing cycle and high cost.

A DBC ceramic substrate is also called a direct-bonded ceramic substrate. This technology uses high-temperature bonding to sinter the copper foil on the upper and lower surfaces of the ceramic. The circuit is formed by etching according to the circuit design. This process makes the DBC ceramic substrate unable to obtain a concave sealed chamber on its surface, so it can not realize vacuum hermetic packaging and cannot prepare vertical via holes to realize the interconnection of the upper and lower circuits. Thus, the multi-chip serial and parallel connection and wiring are difficult. The above problems have severely restricted the application of such ceramic substrates in power semiconductor packages.

SUMMARY OF THE INVENTION

In view of the defects of the prior art, the primary object of the present invention is to provide a ceramic module for power semiconductor integrated packaging and a preparation method thereof, which can effectively solve the problems of inaccurate size, high curvature, poor heat dissipation, no recessed sealed cavity and inconvenience for multichip integration of the conventional ceramic substrate.

In order to achieve the aforesaid object, the present invention adopts the following technical solutions:

According to one aspect of the present invention, a ceramic module for power semiconductor integrated packaging is provided. The ceramic module comprises a ceramic substrate and an integrated metal dam layer. A lower surface of the ceramic substrate is provided with a conductive circuit layer, an insulating layer, and a heat dissipation layer. The insulating layer completely covers the conductive circuit layer. The heat dissipation layer is located on an area outside the conductive circuit layer and spaced apart from the conductive circuit layer. The heat dissipation layer has a thickness not less than a total thickness of the conductive circuit layer and the insulation layer. An upper surface of the ceramic substrate is provided with a positive electrode pad, a negative electrode pad, and a plurality of die bonding regions. The die bonding regions each have a connecting layer and a die bonding layer. The connecting layer and the die bonding layer are spaced apart from each other. The ceramic substrate is provided with vertical via holes. The vertical via holes are electrically connected between the die bonding regions and the conductive circuit layer and between the conductive circuit layer and the positive electrode pad and the negative electrode pad, respectively. The integrated metal dam layer is disposed on the upper surface of the ceramic substrate. The integrated metal dam layer surrounds a periphery of a single one or the plurality of die bonding regions and is spaced apart from the die bonding regions. The integrated metal dam layer has a thickness greater than that of the die bonding regions.

According to another aspect of the present invention, a preparation method of a ceramic module for power semiconductor integrated packaging is provided. The preparation method comprises the following steps:

(1) providing a ceramic substrate and perforating the ceramic substrate;

(2) metalizing upper and lower surfaces of the ceramic substrate;

(3) sticking a dry film, exposing, developing and electroplating the ceramic substrate with the metalized upper and lower surfaces to form a positive electrode pad, a negative electrode pad, a connecting layer, a die bonding layer, an integrated metal dam bottom layer, a conductive circuit layer, a heat dissipation bottom layer, and vertical via holes;

(4) sticking a dry film, exposing, developing and electroplating the upper and lower surfaces of the ceramic substrate again, so that the integrated metal dam bottom layer and the heat dissipation bottom layer are each electroplated and thickened to obtain an integrated metal dam layer and a heat dissipation layer;

(5) removing the films and etching the ceramic substrate; and (6) applying an insulating material to the lower surface of the ceramic substrate to form an insulating layer.

According to a further aspect of the present invention, a preparation method of a ceramic module for power semiconductor integrated packaging is provided. The preparation method comprises the following steps:

(1) providing a ceramic substrate and perforating the ceramic substrate;

(2) metalizing upper and lower surfaces of the ceramic substrate;

(3) sticking a dry film, exposing, developing and electroplating the ceramic substrate with the metalized upper and lower surfaces to form a positive electrode pad, a negative electrode pad, a connecting layer, a die bonding layer, an integrated metal dam bottom layer, a conductive circuit layer, a heat dissipation bottom layer, and vertical via holes;

(4) sticking a dry film, exposing, developing and electroplating the upper and lower surfaces of the ceramic substrate again, so that the integrated metal dam bottom layer and the heat dissipation bottom layer are each electroplated and thickened to obtain an integrated metal dam layer and a heat dissipation layer;

(5) sticking a dry film, exposing, developing and electroplating the upper surface of the ceramic substrate again, so that a part of the integrated metal dam layer is electroplated and thickened to obtain a stepped surface and a stepped layer;

(6) removing the films and etching the ceramic substrate; and (7) applying an insulating material to the lower surface of the ceramic substrate to form an insulating layer.

Compared with the prior art, the present invention has obvious advantages and beneficial effects. Specifically, it can be known from the above technical solutions:

By providing the integral metal dam layer on the upper surface of the ceramic substrate and forming cavities around the die bonding regions, the semiconductor chip can be hermetically sealed. By providing the heat dissipation layer on the lower surface of the ceramic substrate, the heat generated by the semiconductor chip can be quickly conducted to the outside to improve the heat dissipation performance. By providing the conductive circuit layer and the vertical via holes, a multi-chip series and parallel connection can be realized on the lower surface of the ceramic substrate. The present invention can realize multi-chip integrated packaging of power semiconductors, having the advantages of good thermoelectric separation, high air tightness, low thermal resistance, compact structure, etc. The production process is simply and the product consistency is high.

DETAILED DESCRIPTION OF THE PREFERRED EMBODIMENTS

Figure 1:
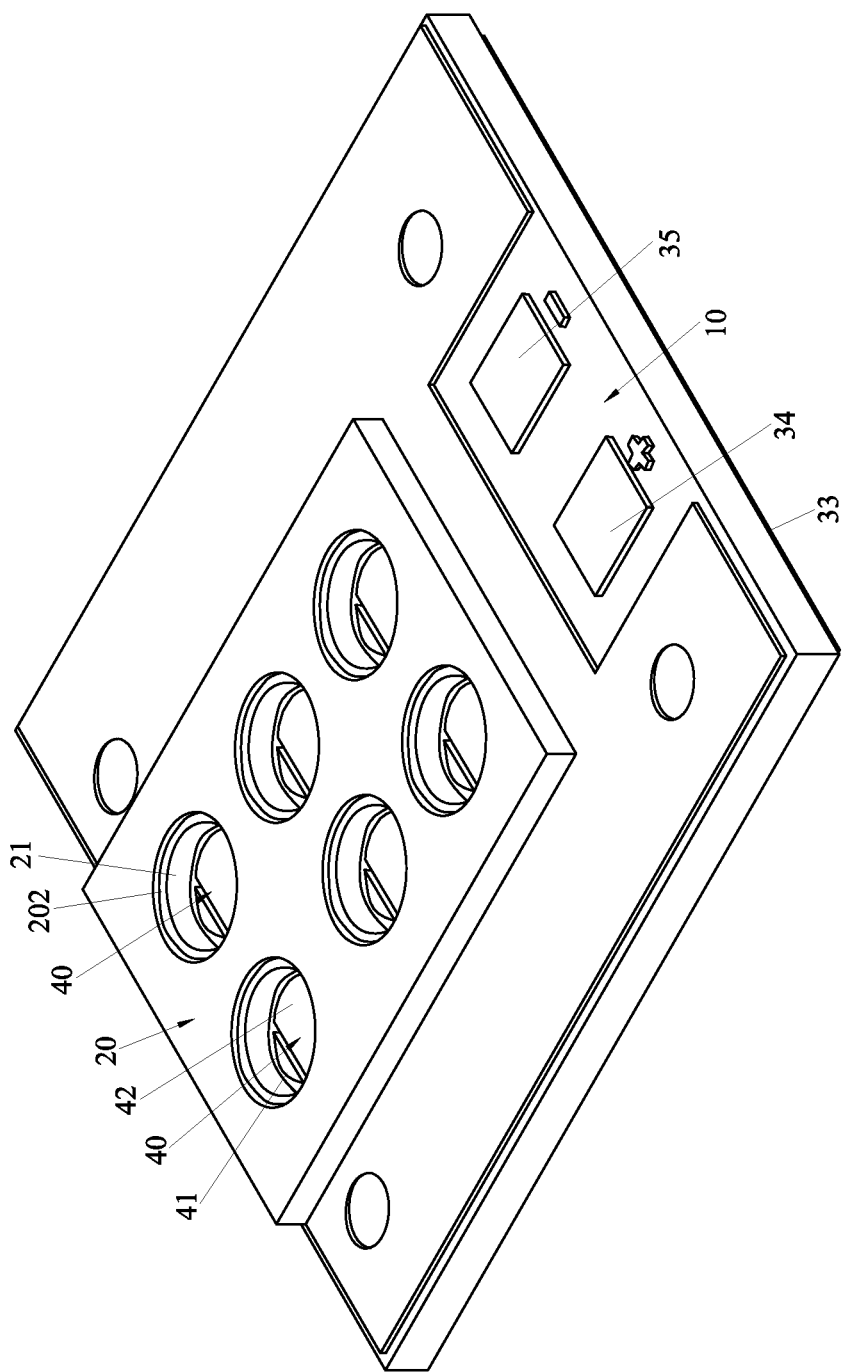
FIG. 1 is a perspective view according to a preferred embodiment of the present invention.
Figure 1A:
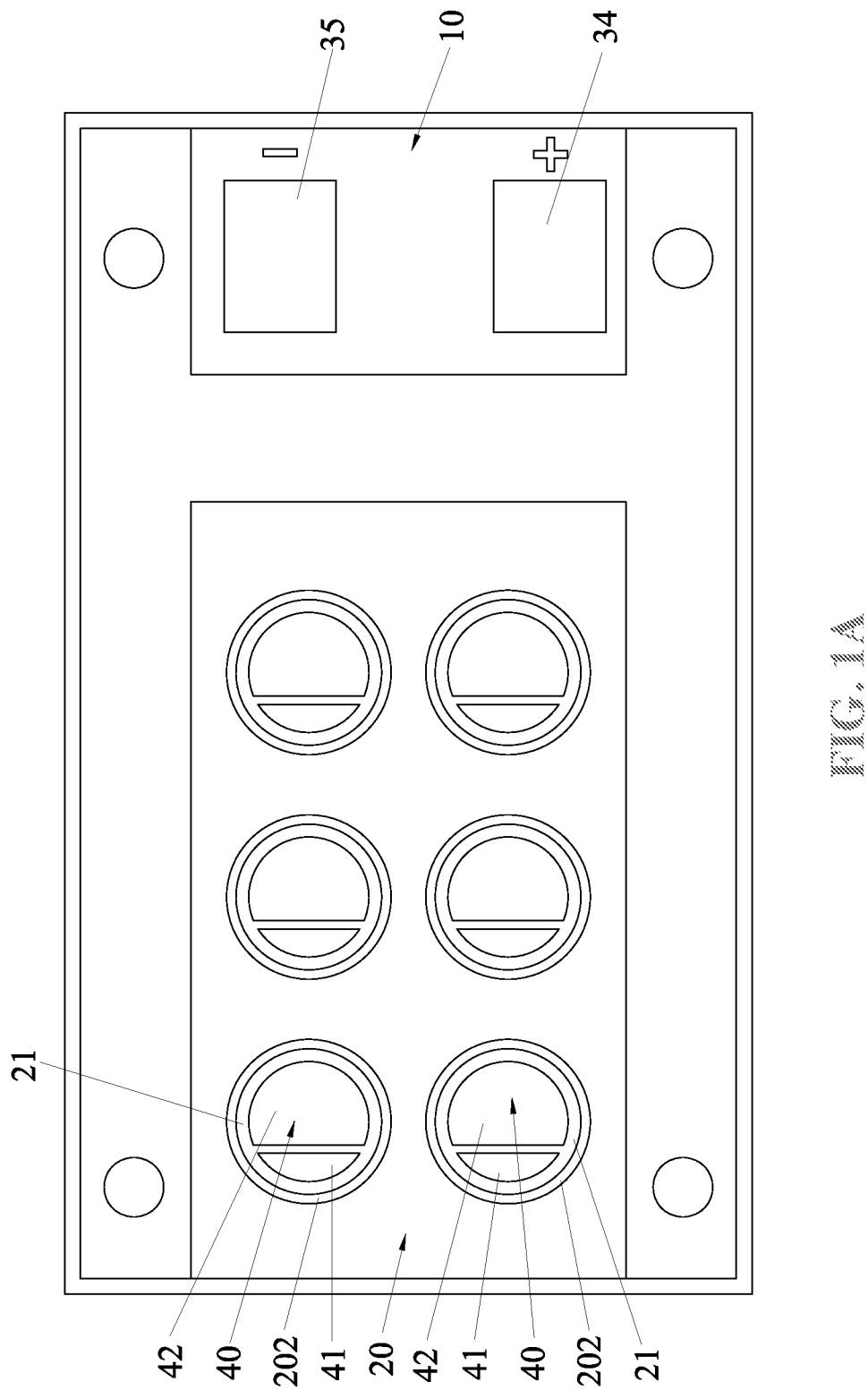
FIG. 1A is a top plan view of the preferred embodiment of the present invention.
Figure 2:
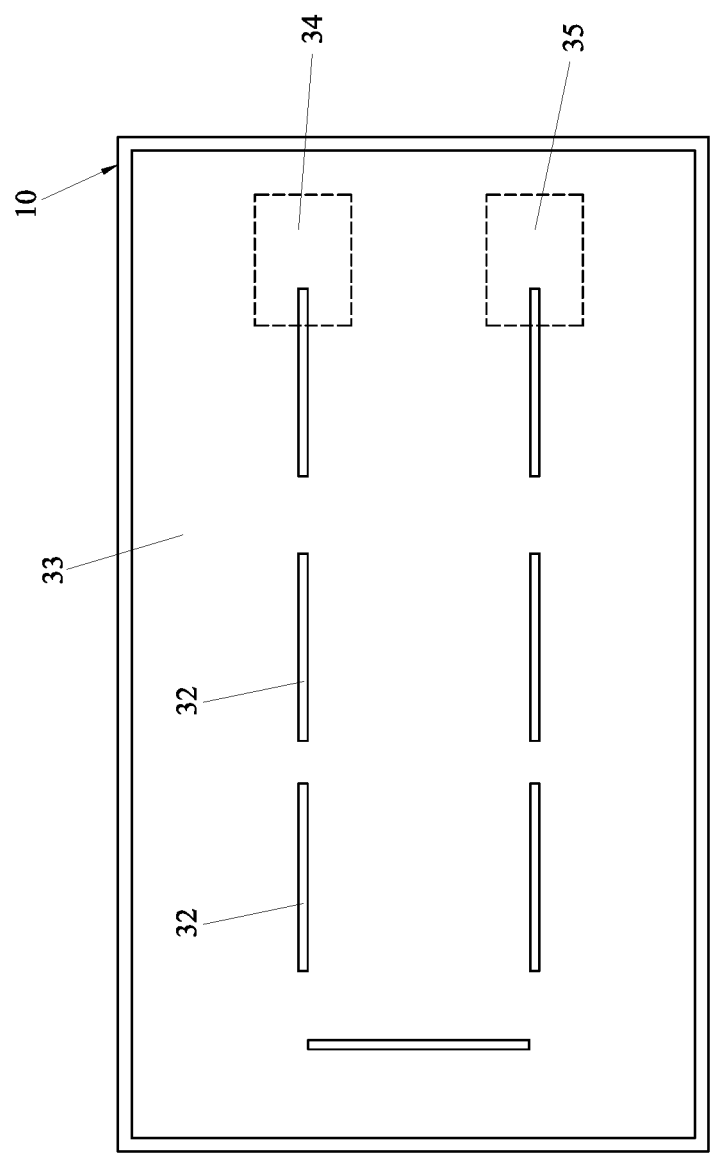
FIG. 2 is a bottom view according to the preferred embodiment of the present invention.
Figure 3:
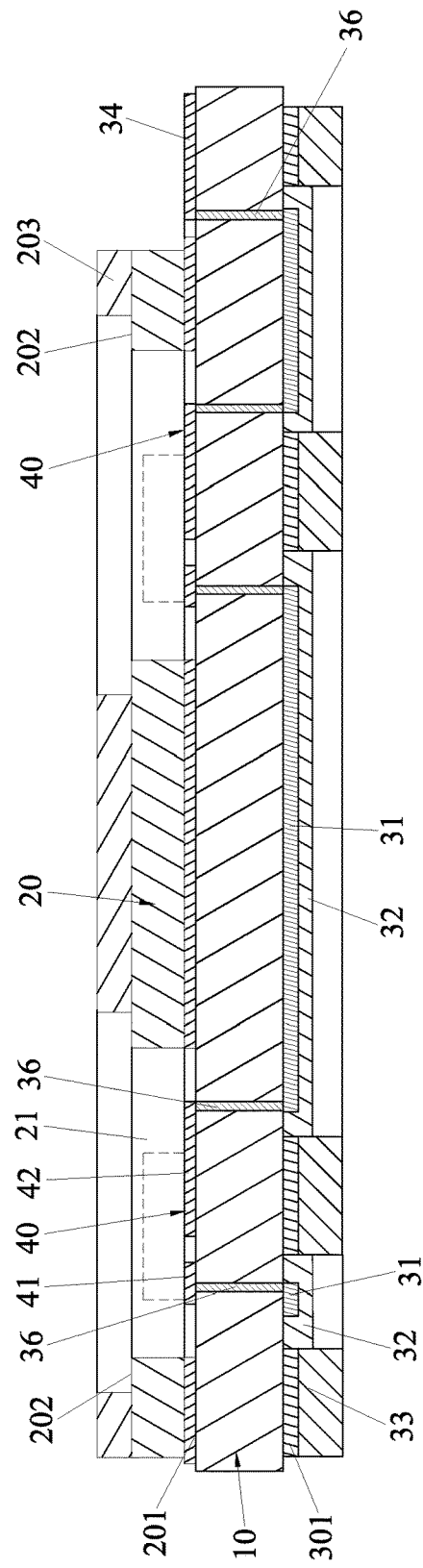
FIG. 3 is a partial sectional view according to the preferred embodiment of the present invention.

Please refer to FIGS. 1 to 3, which show a specific structure of a preferred embodiment of the present invention, comprising a ceramic substrate 10 and an integrated metal dam layer 20.

The lower surface of the ceramic substrate 10 is provided with a conductive circuit layer 31, an insulating layer 32, and a heat dissipation layer 33. The insulating layer 32 completely covers the conductive circuit layer 31. The heat dissipation layer 32 is located on the area outside the conductive circuit layer 31 and spaced apart from the conductive circuit layer 31. The thickness of the heat dissipation layer 33 is not less than the total thickness of the conductive circuit layer 31 and the insulation layer 32. In this embodiment, both the conductive circuit layer 31 and the heat dissipation layer 33 are made of an electroplated copper material. The thickness of the heat dissipation layer 33 is greater than the thickness of the conductive circuit layer 31. The insulating layer 32 is made of white or green ink. The thickness of the insulating layer 32 is less than the thickness of the heat dissipation layer 33.

The upper surface of the ceramic substrate 10 is provided with a positive electrode pad 34, a negative electrode pad 35, and a plurality of die bonding regions 40. Each of the die bonding regions 40 has a connecting layer 41 and a die bonding layer 42. The connecting layer 41 and the die bonding layer 42 are spaced apart from each other. In this embodiment, the positive electrode pad 34 and the negative electrode pad 35 are located on the periphery of the upper surface of the ceramic substrate 10, and are spaced apart from the integrated metal dam layer 20. The plurality of die bonding regions 40 are arranged in an array.

The ceramic substrate 10 is provided with vertical via holes 36. The vertical via holes 36 are electrically connected between the die bonding regions 40 and the conductive circuit layer 31 and between the conductive circuit layer 31 and the positive electrode pad 34 and the negative electrode pad 35, respectively. That is, the connecting layers 41 and the die bonding layers 42 are electrically connected to the conductive circuit layer 31 through the corresponding vertical via holes 36, respectively; and the positive electrode pad 34 and the negative electrode pad 35 are respectively connected to the conductive circuit layer 31 through the corresponding vertical via holes 36, thereby forming a series and parallel circuit structure. In this embodiment, the vertical via holes 36 are filled with external metal or electroplated copper. Further, the ceramic substrate 10 is made of aluminum oxide ($Al_2O_3$) ceramic, aluminum nitride (AlN) ceramic, silicon nitride ($Si_3N_4$) ceramic or silicon carbide (SiC) ceramic, but not limited thereto. Aluminum oxide ceramic is inexpensive. Aluminum nitride ceramic has a good heat dissipation effect. Silicon nitride ceramic has high strength. Silicon carbide ceramic is moderately priced, with good heat dissipation.

The integrated metal dam layer 20 is disposed on the upper surface of the ceramic substrate 10. The integrated metal dam layer 20 surrounds the periphery of a single one or the plurality of die bonding regions 40 and is spaced apart from the die bonding regions 40. The thickness of the integrated metal dam layer 20 is greater than the thickness of the die bonding regions 40. In this embodiment, the integrated metal dam layer 20 is made of an electroplated copper material. In addition, the integrated metal dam layer 20 has a plurality of cavities 21, and the plurality of cavities 21 are also arranged in an array. The die bonding regions 40 are located in the corresponding cavities 21, respectively. In other words, the peripheral edge of the cavity 21 is recessed to form a stepped surface 202.

The present invention also discloses a preparation method of a ceramic module for power semiconductor integrated packaging, comprising the following steps:

(1) providing a ceramic substrate 10 and perforating the ceramic substrate 10;

(2) metalizing upper and lower surfaces of the ceramic substrate 10;

(3) sticking a dry film, exposing, developing and electroplating the ceramic substrate 10 with the metalized upper and lower surfaces to form a positive electrode pad 34, a negative electrode pad 35, a connecting layer 41, a die bonding layer 42, an integrated metal dam bottom layer 201, a conductive circuit layer 31, a heat dissipation bottom layer 301, and vertical via holes 36;

(4) sticking a dry film, exposing, developing and electroplating the upper and lower surfaces of the ceramic substrate 10 again, so that the integrated metal dam bottom layer 201 and the heat dissipation bottom layer 301 are each electroplated and thickened to obtain an integrated metal dam layer 20 and a heat dissipation layer 33;

(5) removing the films and etching the ceramic substrate (10); and (6) applying an insulating material to the lower surface of the ceramic substrate 10 to form an insulating layer 32.

The method further comprises the step (7): plating gold/silver (not shown) on the surface of each metal layer of the ceramic substrate (10), that is, the surfaces of the positive electrode pad 34, the negative electrode pad 35, the connecting layer 41, the die bonding layer 42, the integral metal dam layer 20 and the heat dissipation layer 33 are plated with gold/silver.

The present invention further discloses another preparation method of a ceramic module for power semiconductor integrated packaging, comprising the following steps:

(1) providing a ceramic substrate 10 and perforating the ceramic substrate 10;

(2) metalizing upper and lower surfaces of the ceramic substrate 10;

(3) sticking a dry film, exposing, developing and electroplating the ceramic substrate 10 with the metalized upper and lower surfaces to form a positive electrode pad 34, a negative electrode pad 35, a connecting layer 41, a die bonding layer 42, an integrated metal dam bottom layer 201, a conductive circuit layer 31, a heat dissipation bottom layer 301, and vertical via holes 36;

(4) sticking a dry film, exposing, developing and electroplating the upper and lower surfaces of the ceramic substrate 10 again, so that the integrated metal dam bottom layer 201 and the heat dissipation bottom layer 301 are each electroplated and thickened to obtain an integrated metal dam layer 20 and a heat dissipation layer 33;

(5) sticking a dry film, exposing, developing and electroplating the upper surface of the ceramic substrate 10 again, so that a part of the integrated metal dam layer 20 is electroplated and thickened to obtain a stepped surface 202 and a stepped layer 203;

(6) removing the films and etching the ceramic substrate (10); and (7) applying an insulating material to the lower surface of the ceramic substrate 10 to form an insulating layer 32.

The method further comprises the step (8): plating gold/silver (not shown) on the surface of each metal layer of the ceramic substrate (10), that is, the surfaces of the positive electrode pad 34, the negative electrode pad 35, the connecting layer 41, the die bonding layer 42, the integral metal dam layer 20 and the heat dissipation layer 33 are plated with gold/silver.

What is claimed is:

1. A ceramic module for power semiconductor integrated packaging, comprising a ceramic substrate and an integrated metal dam layer; a lower surface of the ceramic substrate being provided with a conductive circuit layer, an insulating layer and a heat dissipation layer, the insulating layer completely covering the conductive circuit layer, the heat dissipation layer being located on an area outside the conductive circuit layer and spaced apart from the conductive circuit layer, the heat dissipation layer having a thickness not less than a total thickness of the conductive circuit layer and the insulation layer; an upper surface of the ceramic substrate being provided with a positive electrode pad, a negative electrode pad and a plurality of die bonding regions, the die bonding regions each having a connecting layer and a die bonding layer, the connecting layer and the die bonding layer being spaced apart from each other; the ceramic substrate being provided with vertical via holes, the vertical via holes being electrically connected between the die bonding regions and the conductive circuit layer and between the conductive circuit layer and the positive electrode pad and the negative electrode pad respectively; the integrated metal dam layer being disposed on the upper surface of the ceramic substrate, the integrated metal dam layer surrounding a periphery of a single one or the plurality of die bonding regions and being spaced apart from the die bonding regions, the integrated metal dam layer having a thickness greater than that of the die bonding regions;

wherein the integrated metal dam layer is formed with a plurality of cavities each of which extends from a top surface of the integrated metal dam to the upper surface of the ceramic substrate, each of the plurality of cavities defining one of the die bonding regions, the connecting layer and the die bonding layer of the one of the die bonding region being disposed on a part of the upper surface of the ceramic substrate that is located inside the cavity such that each of the connecting layer and the die bonding layer is connected to one of the vertical via holes; and wherein each one of the die bonding regions is separated from adjacent ones of the die bonding regions by the integrated metal dam and the connecting layer and the die bonding layer of said each one of the die bonding regions are each connected to one of the connecting layer and the die bonding layer of an adjacent one of the die bonding regions by means of the vertical via holes connected thereto and a part of the conductive circuit layer connected between the via holes that are connected to said each one of the die bonding regions and said adjacent one of the die bonding regions so that said each one and said adjacent one of the die bonding regions that are provided on the upper surface of the ceramic substrate are electrically connected to each other by means of the part of the conductive circuit layer provided on the lower surface of the ceramic substrate and the plurality of die bonding regions are connected to each other and are also connected to the positive and negative electrode pads by means of the conductive circuit layer provided on an opposite side of the ceramic substrate.

2. The ceramic module as claimed in claim 1, wherein the ceramic substrate is made of aluminum oxide ceramic, aluminum nitride ceramic, silicon nitride ceramic, or silicon carbide ceramic.

3. The ceramic module as claimed in claim 1, wherein both the conductive circuit layer and the heat dissipation layer are made of an electroplated copper material, and the thickness of the heat dissipation layer is greater than the thickness of the conductive circuit layer.

4. The ceramic module as claimed in claim 1, wherein the integrated metal dam layer is made of an electroplated copper material.

5. The ceramic module as claimed in claim 1, wherein the positive electrode pad and the negative electrode pad are located on a periphery of the upper surface of the ceramic substrate and are spaced apart from the integrated metal dam layer.

6. The ceramic module as claimed in claim 1, wherein the vertical via holes are filled with external metal or electroplated copper.

7. A preparation method of the ceramic module as claimed in claim 1, comprising the following steps:
   (1) providing the ceramic substrate and perforating the ceramic substrate;
   (2) metalizing the upper and lower surfaces of the ceramic substrate;
   (3) sticking a dry film, exposing, developing and electroplating the ceramic substrate with the metalized upper and lower surfaces to form the positive electrode pad, the negative electrode pad, the connecting layer, the die bonding layer, an integrated metal dam bottom layer, the conductive circuit layer, a heat dissipation bottom layer, and the vertical via holes;
   (4) sticking a dry film, exposing, developing and electroplating the upper and lower surfaces of the ceramic substrate again, so that the integrated metal dam bottom layer and the heat dissipation bottom layer are each electroplated and thickened to obtain the integrated metal dam layer and the heat dissipation layer;
   (5) removing the films and etching the ceramic substrate; and
   (6) applying an insulating material to the lower surface of the ceramic substrate to form the insulating layer.

8. The preparation method as claimed in claim 7, further comprising the step (7): plating gold/silver on respective surfaces of the positive electrode pad, the negative electrode pad, the connecting layer, the die bonding layer, the integral metal dam layer and the heat dissipation layer.

9. A preparation method of the ceramic module as claimed in claim 1, comprising the following steps:
   (1) providing the ceramic substrate and perforating the ceramic substrate;
   (2) metalizing the upper and lower surfaces of the ceramic substrate;
   (3) sticking a dry film, exposing, developing and electroplating the ceramic substrate with the metalized upper and lower surfaces to form the positive electrode pad, the negative electrode pad, the connecting layer, the die bonding layer, an integrated metal dam bottom layer, the conductive circuit layer, a heat dissipation bottom layer, and the vertical via holes;
   (4) sticking a dry film, exposing, developing and electroplating the upper and lower surfaces of the ceramic substrate again, so that the integrated metal dam bottom layer and the heat dissipation bottom layer are each electroplated and thickened to obtain the integrated metal dam layer and the heat dissipation layer;
   (5) sticking a dry film, exposing, developing and electroplating the upper surface of the ceramic substrate again, so that a part of the integrated metal dam layer is electroplated and thickened to obtain a stepped surface and a stepped layer;
   (6) removing the films and etching the ceramic substrate; and
   (7) applying an insulating material to the lower surface of the ceramic substrate to form the insulating layer.

10. The preparation method as claimed in claim 9, further comprising the step (8): plating gold/silver on respective surfaces of the positive electrode pad, the negative electrode pad, the connecting layer, the die bonding layer, the integral metal dam layer and the heat dissipation layer.

* * * * *